United States Patent [19]

McIntyre

[11] Patent Number: 5,015,966

[45] Date of Patent: May 14, 1991

[54] FOLDED CASCODE AMPLIFIER

[75] Inventor: Harry J. McIntyre, Los Angeles, Calif.

[73] Assignee: Xerox Corporation, Stamford, Conn.

[21] Appl. No.: 517,019

[22] Filed: May 1, 1990

[51] Int. Cl.[5] ............................................. H03F 3/45
[52] U.S. Cl. .................................... 330/253; 330/255; 330/258; 330/311
[58] Field of Search ................ 330/253, 295, 258, 311

[56] References Cited

U.S. PATENT DOCUMENTS

| | | | |
|---|---|---|---|
| 4,333,058 | 6/1982 | Hoover | 330/253 |
| 4,377,789 | 3/1983 | Hoover | 330/253 |
| 4,554,515 | 11/1985 | Burson et al. | 330/261 |
| 4,797,631 | 1/1989 | Hsu et al. | 330/253 |

OTHER PUBLICATIONS

De La Plaza et al., "Power-Supply Rejection in Differential Switched-Capacitor Filters", *IEEE Journal of Solid-State Circuits*, vol. SC-19, No. 6, Dec. 1984, pp. 912-918.
Joseph N. Babanezhad, "A Rail-to-Rail CMOS Op Amp," *IEEE Journal of Solid-State Circuits*, vol. 23, No. 6, Dec. 1988, p. 1414 et. seq.

*Primary Examiner*—James B. Mullins
*Attorney, Agent, or Firm*—Daniel J. O'Neill

[57] ABSTRACT

An operational amplifier comprises two amplifiers of like circuit configuration and complementary conductivity type connected in parallel. Each amplifier includes a folded cascode input section for providing a first stage of amplification, a class A, push-pull output section for providing a final stage of amplification, a bias section for providing bias voltages to the other sections, and a common made feedback (CMF) section. Each CMF section adjusts the output voltage of its associated input stage to the desired quiescent voltage to compensate for any process differences in the input section. To minimize quiescent power consumption, each CMF section and its associated input section are designed to set the quiescent output voltage of the input section to a level that biases the output transistors of the output section at their threshold voltages.

2 Claims, 3 Drawing Sheets

FOLDED CASCODE AMPLIFIER

FIELD OF THE INVENTION

This invention relates to an operational amplifier, and more particularly to such an amplifier using CMOS technology and rail-to-rail operating range on both the input and the output.

BACKGROUND OF THE INVENTION

Operational Amplifiers (opamps) are a basic building block for analog circuits and are used extensively in a wide variety of applications. However, the usefulness of the typical opamp is restricted by its "non-ideal" characteristics. For example, the common-mode input range for a typical opamp is limited to the rail to rail voltage minus 1 or more volts. Moreover, a typical opamp can maintain neither a rail-to-rail output range nor an accurate output voltage under heavy DC loads.

SUMMARY OF THE INVENTION

In accordance with the invention, an amplifier comprises a pair of amplifiers of like circuit configuration which are connected in parallel and are of complementary conductivity type to each other to allow rail-to-rail common-mode input voltages. Each amplifier comprises a folded cascode input section, a class A push-/pull amplifier in an output section, a bias section for providing bias voltages to the other sections, and a common mode feedback (CMF) section, respectively. CMF sections regulate the common mode signal level sent by respective input sections to respective output sections. The input section is designed to provide an amplified differential voltage to the output section and designed in conjunction with the CMF section to set the quiescent values of the input to the output section at Vth from the rail voltages, an operating point that minimizes power dissipation yet increases output drive. Other aspect of the invention will become apparent from the following description with reference to the drawings, wherein:

DESCRIPTION OF THE PREFERRED EMBODIMENT

Figure 1:
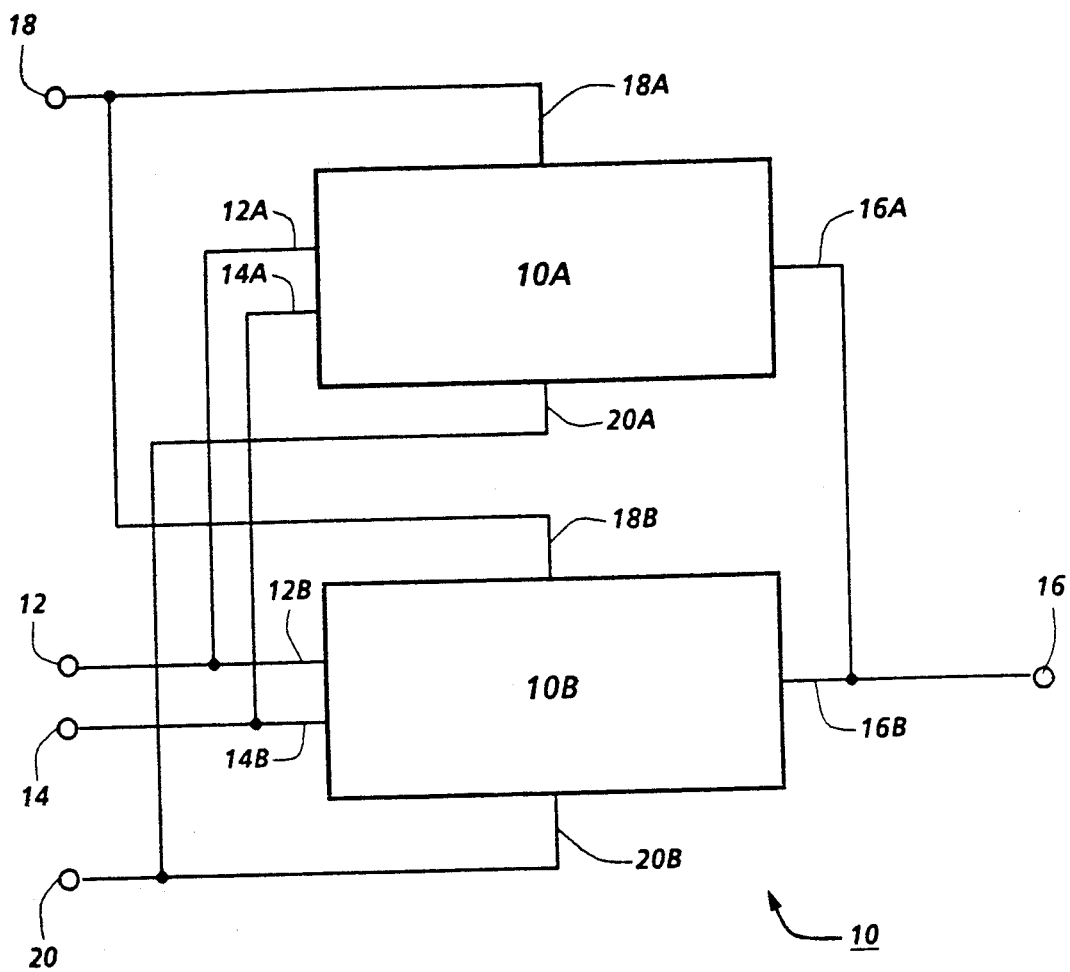
FIG. 1 is a system block diagram of an operational amplifier produced in accordance with the present invention, showing two parallel amplifier subsystems.

Referring now to FIG. 1 there is shown an embodiment of the invention using MOS transistors. Operational amplifier 10 receives input signals at input terminals 12 and 14, supplies amplified output signals at output terminal 16, and receives relatively positive operating potential $V_{DD}$ from supply terminal 18 and relatively negative operating potential $V_{SS}$ from supply terminal 20.

Amplifier 10 comprises a pair of amplifiers 10A and 10B of like circuit configuration which are connected in parallel and are of complementary conductivity type to each other to allow rail-to-rail common-mode input voltages. Amplifiers 10A and 10B have their respective inverting input connections 12A and 12B connected to input terminal 12, their respective noninverting input connections 14A and 14B connected to input terminal 14, and their respective output connectors 16A and 16B connected to output terminal 16.

Figure 2:
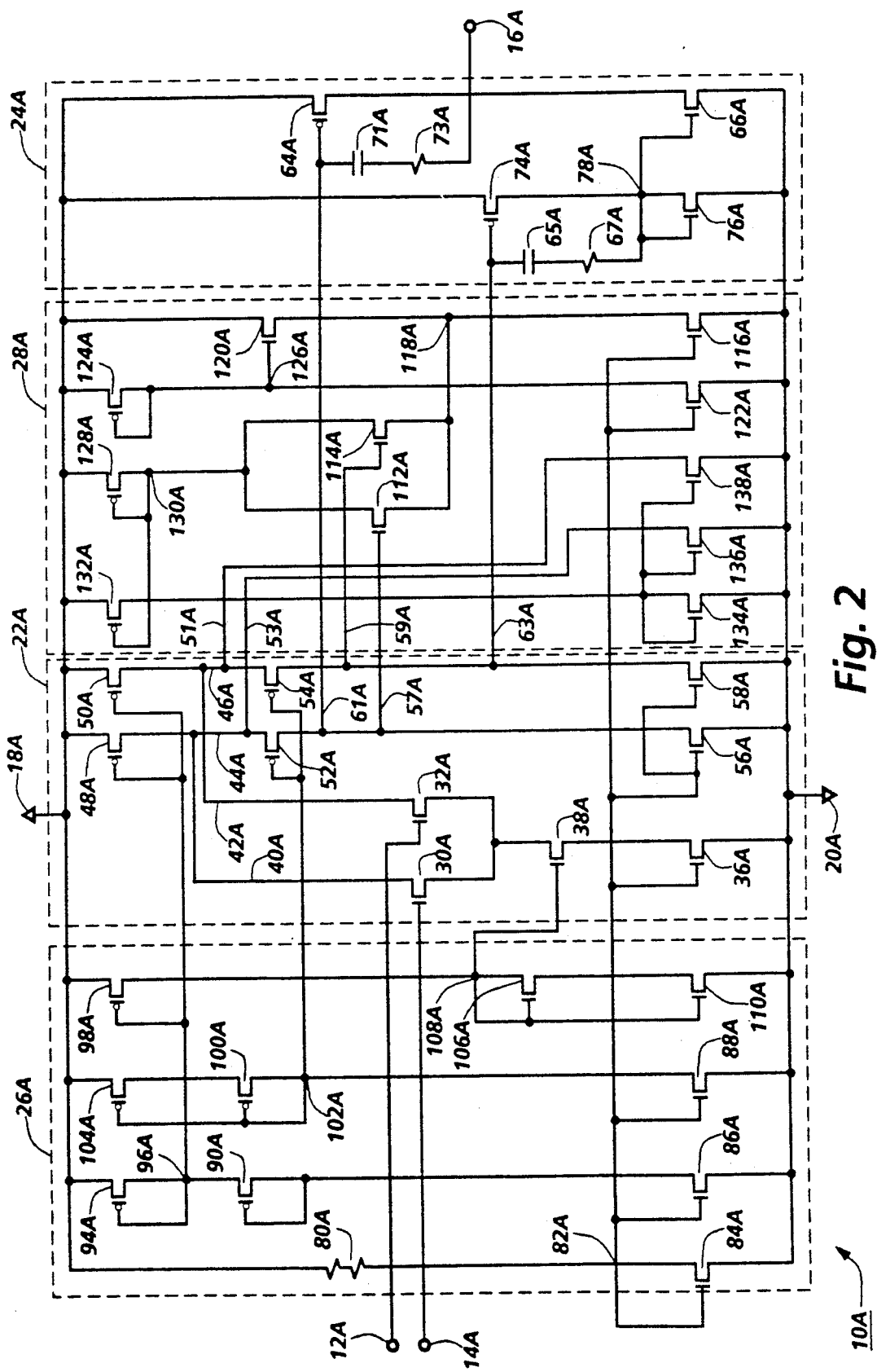
FIG. 2 is a schematic diagram of one of the amplifier subsystems of the operational amplifier of FIG. 1.
Figure 3:
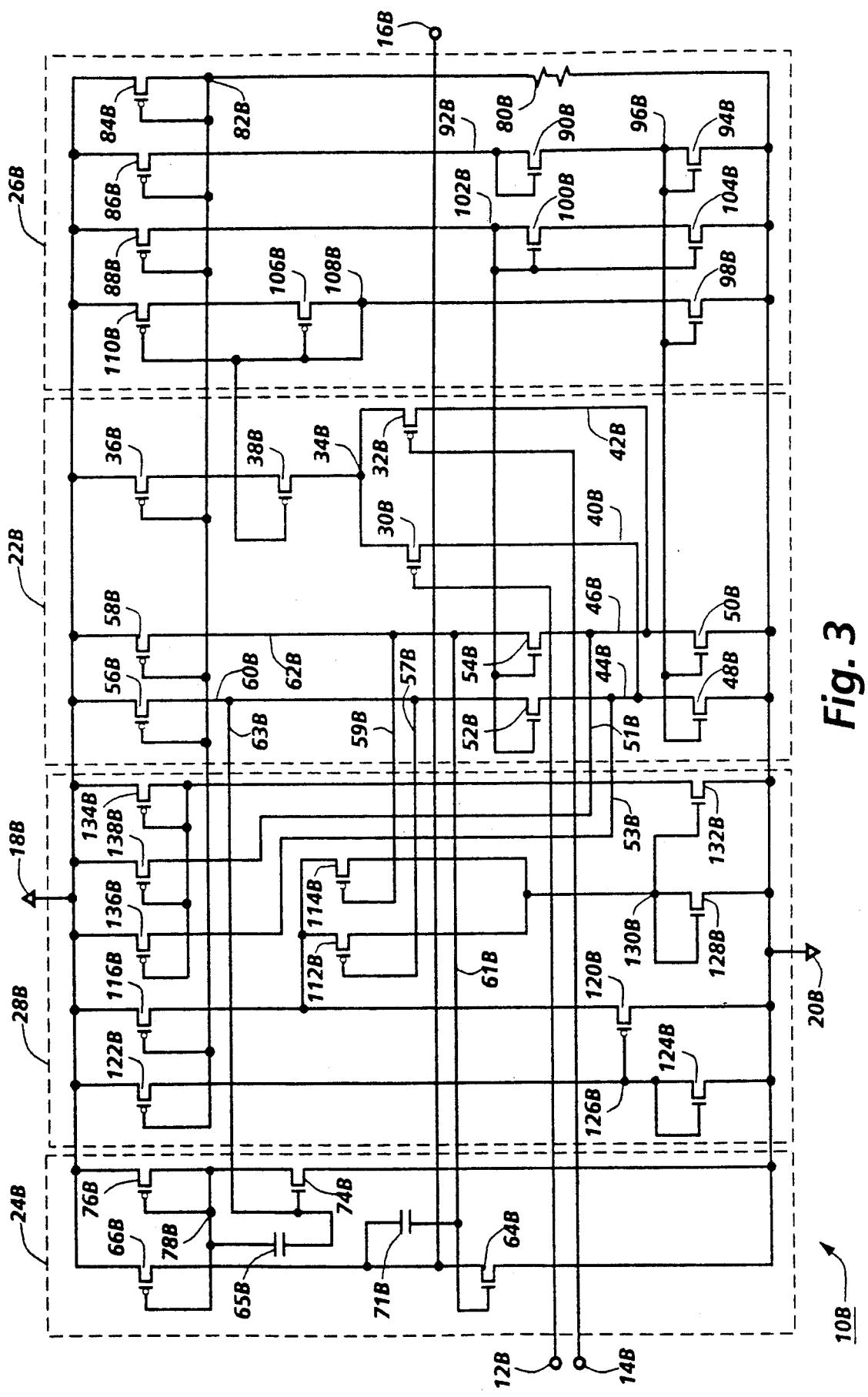
FIG. 3 is a schematic diagram of the other amplifier subsystems of the operational amplifier of FIG. 1.

Referring now to FIGS. 2 and 3, each amplifier 10A and 10B comprises an input section 22A and 22B, an output section 24A and 24B, a bias section 26A and 26B, and a common mode feedback (CMF) section 28A and 28B, respectively. Input sections 22A and 22B provide a first stage of amplification to drive output sections 24A and 24B, respectively. Output sections 24A and 24B provide a final stage of amplification, and a high current drive capability. CMF sections 28A and 28B regulate the common mode signal level sent by respective input sections 22A and 22B to respective output sections 24A and 24B. Bias sections 26A and 26B provide bias voltages required by input sections 22A and 22B and CMF sections 28A and 28B.

Referring now to FIG. 2 input section 22A of amplifier 10A comprises a folded cascode amplifier. The folded cascode amplifier includes matched N-channel transistors 30A and 32A which are configured as a differential pair. Transistors 30A and 32A have their respective gates connected to receive input signals from terminals 12A and 14A, and have their respective sources connected together at node 34A. Operating current is drawn from transistors 30A and 32A by a current sink that is connected between supply terminal 20 ($V_{SS}$), and the sources of transistors 30A and 32A (at node 34A). The current sink comprises N-channel transistor 36A and N-channel transistor 38A. Transistor 36A has its source connected to supply terminal 20 ($V_{SS}$), its drain connected to the source of transistor 38A, and its gate adapted to be biased by a bias voltage $V_{NBN1}$, which is provided by the bias section 26A. Transistor 38A has its drain connected to the sources of transistors 30A and 32A at node 34A, and its gate adapted to be biased by a bias voltage $V_{NBN4}$, which is provided by bias section 26A. Transistor 38A is constructed with a channel width-to-length ratio much greater than that of transistor 36A to provide the current source with current stability at low operating voltages.

Transistors 30A and 32A have their respective drains connected to the respective drains of matched P-channel transistors 48A and 50A, to the respective sources of matched P-channel transistors 52A and 54A, and to respective lines 51A and 53A. Transistors 48A and 50A have their sources connected to terminal 18 ($V_{DD}$), and are biased by having a voltage $V_{NBN2}$ (which is provided by bias section 24A) applied to their gates. Transistors 52A and 54A have their gates adapted to be biased by voltage $V_{NBN3}$, which is provided by bias section 24A, and have their drains connected at respective nodes 60A and 62A to respective lines 57A and 59A, to respective lines 61A and 63A, and to the respective drains of matched N-channel transistors 56A and 58A. Transistors 56A and 58A have their gates adapted to be biased by voltage $V_{NBN1}$, which is provided by bias section 26A, and have their sources connected to terminal 20 ($V_{SS}$).

Lines 61A and 63A connect input section 22A to output section 24A. Lines 61A and 63A carry negligable current, and convey to output section 24A the voltage at nodes 60A and 62A, $V_{NNPOS}$ and $V_{NNNEG}$, respectively. In output section 24A, $V_{NNPOS}$ and $V_{NNNEG}$ are amplified by a class A, push-pull amplifier, as discussed further herein.

Lines 51A and 53A and lines 57A and 59A connect input section 22A to CMF section 28A. Lines 51A and 53A carry a position of the current supplied by respective transistors 48A and 50A to CMF section 28A. Lines 57A and 59A carry negligable current, and convey to CMF section 28A the voltage at nodes 60A and 62A, $V_{NNPOS}$ and $V_{NNNEG}$, respectively. CMF section 28A senses the common mode signal level of $V_{NNPOS}$ and $V_{NNNEG}$, and acts to prevent these voltages from exceeding their quiescent values by drawing current along lines 51A and 53A, as discussed further herein.

In input section 22A, transistors 48A and 50A function as current sources to supply operating current to respective transistors 30A and 32A along respective lines 40A and 42A, and to respective transistors 52A and 56A, and transistors 54A and 58A. Transistors 52A and 54A function as cascode devices to ensure that the voltages at respective nodes 44A and 46A remain unchanged with changes in respective voltages, $V_{NNPOS}$ and $V_{NNNEG}$, on respective nodes 61A and 63A. Operating current is drawn through transistors 52A and 54A by respective transistors 56A and 58A, which function as current sinks. Transistors 48A, 50A, 52A, 54A, 56A and 58A are designed so that in the quiescent state the voltages at nodes 60A and 62A, $V_{NNPOS}$ and $V_{NNNEG}$, are controlled by the CMF section 28A.

When no signal is applied across terminals 14A and 12A (quiescent state), transistors 30A and 32A each draw the same amount of current from respective nodes 44A and 46A. Transistors 56A and 58A each draw the same amount of current from respective nodes 44A and 46A, and CMF section 28A draws a constant current along each of lines 51A and 53A, as discussed further herein. When a differential voltage signal is applied across terminals 14A and 12A to the gates of transistors 30A and 32A, lines 40A and 42A carry both a common-mode and a differential current. The differential current causes a differential voltage between respective nodes 60A and 62A ($V_{NNPOS}$ and $V_{NNNEG}$) as charge is either built up or depleted at the drains of transistors 56A and 58A.

Output section 24A comprises a class A push-pull amplifier. This type of amplifier as able to source large currents at output voltages close to $V_{DD}$; and similarly, sink large currents at output voltage close to $V_{SS}$. The class A amplifier includes a complementary pair of a matched P-channel transistor and an N-channel transistor, 64A and 66A, respectively, which are arranged as a class A, push-pull amplifier. Transistor 64A is configured as an inverter, and its gate is driven directly by $V_{NNPOS}$. The gate of transistor 64A is connected by line 61A to node 60A. The source of transistor 64A is connected to supply terminal 18 ($V_{DD}$), and its drain is connected to the drain of transistor 66A at node 68A. The source of transistor 66A is connected to supply terminal 20 ($V_{SS}$). Node 68A is connected to output terminal 16A.

Transistor 66A is configured as an inverter, but it cannot be driven directly by voltage $V_{NNNEG}$. Instead, $V_{NNNEG}$ is first inverted, and the inverted $V_{NNNEG}$ is conveyed to the gate of transistor 66A. To invert $V_{NNNEG}$, $V_{NNNEG}$ is conveyed from node 62A by line 63A to the gate of P-channel transistor 74A. The source of transistor 74A is connected to supply terminal 18 ($V_{DD}$), and the drain is connected to the drain of N-channel transistor 76A at node 78A. The source of transistor 76A is connected to supply terminal 20 ($V_{SS}$). The drain of transistor 76A is also connected to the gate of transistor 76A at node 78A, and to the gate of output transistor 66A. The voltage at the gate of output transistor 66A is inverted $V_{NNNEG}$.

The output section 24A includes frequency stabilization. A capacitor 65A and a resistor 67A are connected in series between the gate of transistor 74A at node 69A and the drain of transistor 74A and the drain and gate of transistor 76A at node 78A. Similarly, a capacitor 71A and a resistor 73A are connected in series between the gate of transistor 64A and the drain of transistor 64A and the drain and gate of transistor 66A at node 68A.

The bias section 26A has four legs, the first of which consists of a resistor 80A producing a current in the amount of $l_1$ and connected between supply terminal 18 ($V_{DD}$), and a node 82A. Current in the amount of $l_1$ is fed into the first part of a current mirror, a N-channel transistor 84A that is connected between node 82A and supply terminal 20 ($V_{SS}$), with the source of transistor 84A connected to supply terminal 20, and the gate and drain connected to node 82A. The voltage at node 84A is $V_{NBN1}$, and it is connected to the gates of transistors 36A, 56A, and 58A of input section 22A, as discussed previously, and to the gates of certain transistors of CMF section 28A, as discussed hereafter. $V_{NBN1}$ is also connected to the gates of transistor 86A and transistor 88A, which are parts of the second and third legs, respectively, of bias section 26A.

In the second leg of bias section 26A, transistor 86A is an N-channel transistor with its source connected to supply terminal 20 ($V_{SS}$), and its drain connected to the drain and gate of P-channel transistor 90A at node 92A. The gate is controlled by $V_{NBN1}$ to produce a current in the amount of $l_1$. Transistor 90A has its source connected to the drain and gate of P-channel transistor 94A at node 96A. The source of transistor 94A is connected to supply terminal 18 ($V_{DD}$). The voltage at node 96A is $V_{NBN2}$, and node 96A is connected to the gates of transistors 48A and 50A of input section 22A. $V_{NBN2}$ is also connected to the gate of transistor 95A in the fourth leg of bias section 26A.

In the third leg of bias section 26A, transistor 88A is a N-channel transistor having its source connected to supply terminal 20 ($V_{SS}$). The gate is biased by $V_{NBN1}$ to produce a current in the amount of $l_1$. The drain of transistor 88A is connected to the drain and gate of P-channel transistor 100A at node 102A. The gate of transistor 100A is also connected to the gate of P-channel transistor 104A, and the source of transistor 100A is connected to the drain of transistor 104A. The source of transistor 104A is connected to supply terminal 18 ($V_{DD}$). The voltage at node 102A is $V_{NBN3}$, and it is connected to the gates of transistors 52A and 54A in the input section 22A.

In the fourth leg of bias section 26A, transistor 98A is a P-channel transistor having its drain connected to supply terminal 18 ($V_{DD}$), and its source connected to the drain of N-channel transistor 106A at node 108A. Transistor 106A is connected with its drain also connected to its gate. The source of transistor 106A is connected to the drain of N-channel transistor 110A, which has its source connected to supply terminal 20 ($V_{SS}$), and its gate connected to the gate of transistor 106A. The voltage at node 108A is $V_{NBN4}$, and it is connected to the gates of transistor 38A in the input section 22A, as previously discussed.

In CMF section 28A, respective lines 57A and 59A connect voltages $V_{NNPOS}$ and $V_{NNNEG}$ to the respective gates of matched N-channel transistors 112A and 114A. Transistors 112A and 114A have their sources connected together and to the drain of N-channel transistor 116A at node 118A. Transistor 116A is a current source that produces a current in the amount of $12l_1$, and has its source connected to supply terminal 20 ($V_{SS}$), and its gate adapted to be biased by $V_{NBN1}$. Also connected at node 118A to the drain of transistor 116A and to the sources of transistors 112A and 114A is the source of an N-channel transistor 120A. The drain of transistor 120A is connected to supply terminal 18 ($V_{DD}$), and the gate is connected to the drain of an N-channel transistor 122A and to the drain and gate of a P-channel transistor 124A at node 126A. The source of transistor 124A is connected to supply terminal 18 ($V_{DD}$). Transistor 122A is matched to transistor 116A, and is a current source that produces a current in the amount of $3.3l_1$, and has its source connected to supply terminal 20 ($V_{SS}$), and its gate is adapted to be biased by bias voltage $V_{NBN1}$.

In the CMF section 28A, the drains of transistors 112A and 114A are connected together and to the drain and gate of a P-channel transistor 128A at node 130A. The source of transistor 128A is connected to supply terminal 18 ($V_{DD}$). Transistor 128A together with transistor 132A form a current mirror, and the gates of transistors 128A and 132A are connected. A current in the amount of $l_2$ flows through the drain and source of transistor 128A is mirrored through transistor 132A. The source of transistor 132A is connected to supply terminal 18 ($V_{DD}$), and the drain is connected to the drain of an N-channel transistor 134A. The source of transistor 134A is connected to supply terminal 20 ($V_{SS}$).

A current mirror is formed by transistor 134A and matched and N-channel transistors 136A and 138A. The gate of transistor 134A is connected to the gates of transistors 136A and 138A. The sources of transistors 136A and 138A are connected to supply terminal 20 ($V_{SS}$), and their respective drains are connected to respective nodes 46A and 44A through lines 53A and 51A, respectively. The current $l_2$ through transistor 134A is mirrored in transistors 136A and 138A so that it flows in respective is mirrored in transistors 136A and 138A so that it flows in respective lines 51A and 53A.

For proper operation of CMF section 28A, the transistors 112A, 114A, 120A and 116A are designed such that the combined current through transistors 112A and 114A into node 118A is negligible compared to the current through transistor 120A into node 118A and out of node 118A through transistor 116A into terminal 20. In this manner, voltage at node 118A is substantially independent of the amount of current drawn by CMF section 28A from input section 22A. The voltage on node 118A is equal to $V_{DD} - (V_{GS}$ of transistor 124A$) - (V_{GS}$ of transistor 120A$)$. Because transistors 112A, 114A and 120A are all NMOS devices and hence share the same threshold voltage $V_{THN}$, transistors 122A and 114A become active when the voltage on nodes 57A and 59A, respectively, increase to or above $V_{DD} - (V_{GS}$ of transistor 124A$)$, and hence activate the CMF section 28A causing charge to be drawn out of nodes 44A and 46A.

The magnitude of the current drawn out of nodes 44A and 46A by respective transistors 112A and 114A is dependent upon the voltage on the respective gates of transistors 112A and 114A and the aspect ratios of transistors 112A and 114A. If the voltage on nodes 60A and 62A were forced to increase towards the voltage on terminal 18 ($V_{DD}$), respective transistors 52A and 54A would be driven into the triode region, and hence would sink less current from respective nodes 44A and 46A. Nodes 44A and 46A would accumulate change resulting in an increase of their voltages. The $V_{DS}$ of transistors 48A and 50A would then decrease resulting in a decrease in the current flowing through transistors 48A and 50A into nodes 44A and 46A.

The aspect ratios of transistors 112A and 114A are designed such that the current that flows through each transistor 136A and 138A reaches $0.30l_1$ before any decrease in the current through respective transistors 48A and 50A occurs. Hence, the CMF section 28A is designed to sink any current from $0.01_1$ to $0.30l_1$ from each of the nodes 44A and 46A in order to maintain a quiescent voltage of $V_{DD} - (V_{GS}$ of transistor 124A$)$ on nodes 60A and 62A.

In the quiescent state, currents flowing into and from nodes 44A and 46A are as follows. Transistors 48A and 50A each source a current of $2l_1$. Transistors 30A and 32A sink a current of $l_1$. Transistors 56A and 58A are designed to sink a current of $0.85l_1$ through transistors 52A and 54A, respectively. The excess of sourced current, $0.15l_1$ is drawn by the CMF section 28A. As the CMF section 28A can sink from $0.01_1$ to $0.30l_1$ current, the CMF section 28A compensates for quiescent current errors of up to $0.15l_1$ due to process inaccuracies and maintains designed quiescent node voltages.

Transistor 122A sinks a small current of $3.3l_1$ through transistor 124A. The CMF section 28A effectively sets the voltage on nodes 57A and 59A to the gate voltage of transistor 124A present on node 60A is passed to the gate of transistor 64A through line 61A. Hence, the $V_{GS}$ of transistor 64A is design to equal the $V_{GS}$ voltage of transistor 124A. Similarly, the $V_{GS}$ voltage of transistor 74A is equal to the $V_{GS}$ voltage of transistor 124A. Hence, the CMF section 28A sets the quiescent power dissipation of transistors 64A and 74A by control their respective quiescent $V_{GS}$ voltages.

Also note that the current sourced by transistor 74A passes through transistor 76A and is mirrored to transistor 66A. Hence the current through 66A is effectively mirrored from the small current of transistor 124A by the CMF section 28A. Hence the quiescent currents in the output section 24A are controlled and kept small by the CMF section 28A.

In this folded cascode amplifier, the quiescent values of $V_{NNNEG}$ and $V_{NNPOS}$ are set at $V_{DD} - (V_{GS}$ of transistor 124A$)$. In this manner, when terminals 12 is positive with respect to terminal 14, $V_{NNPOS}$ remains at its quiescent value while $V_{NNNEG}$ decreases from its quiescent value towards $V_{SS}$. Similarly, when terminals 14 is positive with respect to terminal 12, $V_{NNNEG}$ remains at its quiescent value while $V_{NNPOS}$ decreases from its quiescent value towards $V_{SS}$.

When no signal is applied across terminals 14A and 12A (quiescent state), transistors 30A and 32A each draw a current in the amount of $l_1$ from the current in the amount of $2l_1$ supplied by respective transistors 48A and 50A to respective nodes 44A and 46A. Transistors 56A and 58A each draw a current in the amount of $0.85l_1$ from respective nodes 44A, and CMF section 28A draws a current in the amount of $0.15l_1$ along each of lines 51A and 53A. In this manner the voltages at nodes 57A and 59A are established at $V_{DD} - (V_{GS}$ of transistor 124A$)$.

When there is a large negative voltage difference across terminals 12A and 14A (that causes node 62A to approach the $V_{SS}$ voltage), the current through the cascode transistor 52A will increase (greater than 0.15l₁) by the amount of current decrease through transistor 30A. The charge increase on node 60A will result in a voltage increase in that node above the quiescent value. Although the CMF section 28A is designed to compensate for small current deviation from the quiescent value caused by process variations, it is not designed to overcome the large variations caused by actual signals. Accordingly, the CMF section 28A will not be able to prevent the voltage at node 60A from exceeding the quiescent level and turning off transistor 64A. Hence, when high current sinking is required, transistor 64A is turned off and all the current through transistor 66A is devoted to driving the output load (not shown) at output terminal 16. Similarly, a large positive voltage difference across terminals 12A and 14A (that causes node 60A to approach the $V_{SS}$ voltage), causes like current sourcing condition at the output.

Referring to FIG. 3, amplifier 10B is constructed substantially the same as amplifier 10A, with one main difference: N-channel transistors are replaced by P-channel transistors, and P-channel transistors are replaced by N-channel transistors. All elements which are the same as in amplifier 10A in FIG. 2 are designated by the same reference numeral in FIG. 3, only with an "A" affixed thereto. Correspondingly numbered transistors, e.g., 136A and 136B, are similarly connected to perform similar functions as between amplifiers 10A and 10B, respectively. Similarly, corresponding numbered nodes, e.g., 46A and 46B, and correspondingly numbered lines, e.g., 140A and 140B, denote similar nodes and lines as between amplifiers 10A and 10B, respectively. Moreover, the voltage that corresponds to $V_{NNNEG}$ and $V_{NNPOS}$ are $V_{NPNEG}$ and $V_{NPPOS}$, respectively. $V_{NPNEG}$ and $V_{NPPOS}$ have their quiescent voltages set at $V_{SS}+V_{GS}$ of transistor 124B.

Amplifiers 10A and 10B supply output signals at respective outputs 16A and 16B to output terminal 16 that reinforce each other in response to input signals applied between terminals 12 and 14. When input signals are applied so that the potential of terminal 12 is more positive than that at terminal 14, transistor 32A conducts more heavily than does transistor 30A. As a result, voltage $V_{NNPOS}$ remains at its quiescent value while voltage $V_{NNNEG}$ decreases from its quiescent value and the inverted voltage of $V_{NNNEG}$ drives transistor 66A to conduct more heavily than transistor 64A. Thus, for amplifier 10A, the current flow from output terminal 16A to supply terminal 20 ($V_{SS}$), increases relative to the current flow from supply terminal 18 ($V_{DD}$), to output terminal 16A. In amplifier 10B, that same input signal also causes transistor 30B to conduct more heavily than transistor 32B, which in turn causes $V_{NPPOS}$ to remain at its quiescent level while $V_{NPNEG}$ increases from its quiescent value and drives transistor 64B to conduct more heavily than transistor 66B. As a result, the current flowing from output terminal 16B to supply terminal 20 ($V_{SS}$), is also increased to reinforce the current supplied by amplifier 10A. When the input signals are of opposite polarity to that just described, current flowing from output terminal 16 to supply terminal 20 ($V_{SS}$), decreases relative to that flowing from supply terminal 18 ($V_{DD}$), to output terminal 16 in each of amplifiers 10A and 10B.

What is claimed is:

1. An amplifying circuit comprising:

a. first and second supply terminals for receiving relatively positive and relatively negative operating potentials, respectively;
b. input terminals for receiving input signals thereat; and a signal output terminal;
c. first folded cascode differential amplifier means, including
   first common source circuitry for converting a differential input voltage to a first differential current and operable with a common-mode range to said first supply terminal,
   first cascode device for receiving on an input one side of said first differential current for conversion to a voltage on a first output node,
   second cascode device for receiving on an input the other side of said first differential current for conversion to a voltage on a second output node;
d. second folded cascode differential amplifier means, including:
   second common source circuitry for converting a differential input voltage to a second differential current and operable with a common-mode range to said second supply terminal,
   third cascode device for receiving on an input one side of said second differential current for conversion to a voltage on a third output node,
   fourth cascode device for receiving on an input the other side of said second differential current for conversion to a voltage on a fourth output node;
e. first output amplifier means including:
   first and second input connections connected to respective first and second output nodes,
   first inverter means having an input serving as said second input connection and an output for inverting the signal received at said second input connection,
   first and second field-effect transistors of P-channel and N-channel type, respectively, each in common-source amplifier configuration having respective sources connected to said respective first and second supply terminals, having respective drains connected to said signal output terminal, having the gate of said first field effect transistor serving as said first input connection and having the gate of said second field-effect transistor connected to said first inverter means output;
f. first common mode feedback means connected to said first and second output nodes and to said inputs of said first and second cascode devices for comparing the voltages on said first and second output nodes with a first reference voltage and maintaining said first and second output nodes at said first reference voltage in a negative feedback loop by drawing current from said inputs of said first and second cascode devices, wherein said first reference voltage is set substantially at the difference between the voltage of said first supply terminal and the gate-source threshold voltage of said first field-effect transistor;
g. second output amplifier means including:
   third and fourth input connections connected to respective third and forth output nodes,
   second inverter means having an input serving as said fourth input connection and an output for inverting the signal received at said fourth input connection,
   third and fourth field-effect of P-channel and N-channel type, respectively, each in common-source amplifier configuration having respective sources to said respective first and second supply terminals having respective drains connected to said signal output terminal, having the gate of said third field-effect transistor serving as said third input connection and having the gate of said fourth field-effect transistor connected to said second inverter means output;

h. second common mode feedback means connected to said third and fourth output nodes and to said inputs of said third and fourth cascode devices for comparing the voltages on said third and fourth output nodes with a second reference voltage and maintaining said third and fourth output nodes at said second reference voltage in a negative feedback loop by supplying current to said inputs of said third and fourth cascode devices, wherein said second reference voltage is set substantially at the sum of the voltage of said second supply terminal and the gate-source threshold voltage of said fourth field-effect transistor.

2. The amplifying circuit of claim 1 wherein said first common source circuitry comprises a differential common source amplifier comprising:
  a current source disposed between a first node and said second supply terminal, and
  a pair of differentially connected N-channel transistors having the gates thereof connected between said input terminals and the sources thereof connected to said first node for providing said first differential current at the drains thereof, and wherein said second common source circuitry comprises a differential common source amplifier comprising:
  a current source disposed between a second node and said first supply terminal, and
  a pair of differentially connected P-channel transistors having the gates thereof connected between said input terminals and the sources thereof connected to said second node for providing said second differential current at the drains thereof.

* * * * *